US011393521B2

(12) United States Patent
Ji

(10) Patent No.: US 11,393,521 B2
(45) Date of Patent: Jul. 19, 2022

(54) POWER MODULE AND A MEMORY DEVICE

(71) Applicant: ChangXin Memory Technologies, Inc., Hefei (CN)

(72) Inventor: Rumin Ji, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 0 days.

(21) Appl. No.: 17/268,239

(22) PCT Filed: Feb. 22, 2020

(86) PCT No.: PCT/CN2020/076310
§ 371 (c)(1),
(2) Date: Feb. 12, 2021

(87) PCT Pub. No.: WO2021/056957
PCT Pub. Date: Apr. 1, 2021

(65) Prior Publication Data
US 2022/0115053 A1 Apr. 14, 2022

(30) Foreign Application Priority Data

Sep. 27, 2019 (CN) .......................... 201910922840.6

(51) Int. Cl.
G11C 11/40 (2006.01)
G11C 11/4074 (2006.01)
(Continued)

(52) U.S. Cl.
CPC ........... *G11C 11/4074* (2013.01); *H02M 3/07* (2013.01); *H03K 19/20* (2013.01)

(58) Field of Classification Search
None
See application file for complete search history.

(56) References Cited

U.S. PATENT DOCUMENTS 5,434,814 A 7/1995 Cho et al.
5,953,267 A 9/1999 Oh et al.
(Continued)

FOREIGN PATENT DOCUMENTS

CN 105513646 A 4/2016
CN 109841260 A 6/2019
(Continued)

OTHER PUBLICATIONS

PCT/CN2019/121162 International Search Report dated Jun. 23, 2020, English Translation.

*Primary Examiner* — Tan T. Nguyen
(74) *Attorney, Agent, or Firm* — Alston & Bird LLP

(57) ABSTRACT

A power module and a memory device are disclosed. The power module includes: a voltage raise unit for outputting a power voltage; an enabling unit connected to the power output for generating and outputting an enabling signal; a control unit, includes: an oscillator, a pulse generator, and an OR operation unit; the oscillator generates a delayed pulse control signal with a certain period; the pulse generator connects to the output terminal of the enabling unit for receiving the enable signal, synchronously generates an instant pulse control signal; the OR operation unit performs OR calculation to the delay pulse control signal and the instant pulse control signal to generate a boost control signal. The output end of the control unit connects to the voltage raise unit, and outputs the boost control signal to the voltage raise unit. The above-mentioned power module has a high transient response capability and maintains the stability of the output power voltage.

20 Claims, 8 Drawing Sheets

(51) Int. Cl.
    *H02M 3/07*     (2006.01)
    *H03K 19/20*     (2006.01)

(56) References Cited

U.S. PATENT DOCUMENTS

| | | | |
|---|---|---|---|
| 6,304,498 B1 | 10/2001 | Ideda et al. | |
| 2008/0317097 A1* | 12/2008 | Sohn | G11C 11/40626 374/E7.001 |
| 2009/0115496 A1* | 5/2009 | Lee | H02M 3/07 327/536 |

FOREIGN PATENT DOCUMENTS

| | | |
|---|---|---|
| CN | 2106641 U | 5/2020 |
| WO | WO 2021/056804 A1 | 4/2021 |

\* cited by examiner

POWER MODULE AND A MEMORY DEVICE

CROSS REFERENCES TO RELATED APPLICATIONS

This application is a national phase entry of International Application No. PCTCN2020076310 and filed on Feb. 22, 2020, which claims the benefit of priority to CN Patent Application CN 201910922840.6 filed on Sep. 27, 2019, both entitled "A POWER MODULE AND A MEMORY DEVICE", the contents of which are incorporated herein by reference in its entirety.

TECHNICAL FIELD

The present invention relates to the field of integrated circuits, in particular, to a power module and a memory device.

BACKGROUND

DRAM chips require various power modules, such as charge pumps, linear regulators, etc., powering different functional modules (such as word line drive voltage VPP, back gate bias voltage VBB, bit line pre-charge voltage VCC/2, etc.). During the working process of the DRAM chip, various operation modes are frequently switched. Under different operation modes, the current drawn by each functional module may different from others, which causes the output voltage of the power module to change. For example, in low power consumption mode, when a heavy load suddenly occurs, the output voltage of the power module will be quickly pulled down, and the voltage module will need a certain delay to start voltage boost, during which, there is no extra energy to supply, meanwhile the output voltage of the voltage module continues to decrease, resulting in a large undershot of the output voltage, this process affects the subsequent operations of other modules.

Therefore, how to enhance the transient response of the power module has become a technical problem that needs to be solved urgently.

SUMMARY

The present disclosure provides a power module and a memory device to improve the transient response capability of the power module, thereby improving the stability of the memory device. The power module includes: a voltage raise unit having a power output terminal for outputting power supply voltage; an enable unit connected to the power output terminal for generating an enable signal. When the voltage at the output terminal of the power drops to a set value, the enable signal generates a rising edge; a control unit including: an oscillator, a pulse generator, and an OR operation unit. The oscillator is connected to the output terminal of the enable unit. The oscillator is triggered by the rising edge of the enable signal, and generates a delayed pulse control signal of a certain period. The pulse generator is connected with the output terminal of the enable signal, and generates synchronously an instant pulse control signal while receiving the rising edge of the enable signal. The OR operation unit is connected to the outputs of the oscillator and the pulse generator to perform OR calculation between the delayed pulse control signal and the instant pulse control signal, so as to generate a voltage raise unit control signal. The output terminal of the control unit is connected to the voltage raise unit for outputting a boost power voltage.

Optionally, the voltage raise unit is a charge pump circuit.

Optionally, an enabling unit includes: a comparator and a voltage divider circuit, one terminal of the voltage divider circuit is connected to the power output terminal, the other terminal is grounded. The output terminal of the voltage divider circuit is connected to the negative input terminal of the comparator, and the positive input terminal of the comparator is connected to the reference voltage terminal. The voltage value of the reference voltage terminal is the set value.

Optionally, the voltage dividing circuit includes: a first voltage dividing resistor and a second voltage dividing resistor, a first end of the first voltage dividing resistor is connected to the power output terminal, and the second end is connected to the first end of the second voltage dividing resistor, the second end of the second voltage dividing resistor is grounded, and the connecting note of the first voltage dividing resistor and the second voltage dividing resistor serves as the output terminal of the voltage divider circuit.

Optionally, the OR operation unit includes a NOR gate and a NOT gate (inverter) connected in sequence, and the two input terminals of the NOR gate are respectively connected to the output terminal of the pulse generator and the output terminal of the oscillator, the output terminal of the NOR gate is connected to the input terminal of the NOT gate, and the output terminal of the NOT gate is connected to the input terminal of the voltage raise unit.

Optionally, the pulse generator includes a delay invertor circuit and an AND operation unit; the input terminal of the delay invertor circuit is connected to the output terminal of the enabling unit for inverting the enable signal and delaying the output; the AND operation unit is connected to the output terminal of the delay inversion circuit and the output terminal of the enabling unit, and performs an AND operation between the signal outputs from the delay inversion circuit and the enable signal.

Optionally, the delay invertor circuit includes: a first inverter, a resistor, and a capacitor, the input terminal of the first inverter is connected to the output terminal of the enabling unit, and the first inverter's output terminal is connected to the first end of the resistor, the second end of the resistor is connected to the first end of the capacitor, the second end of the capacitor is grounded, and the first end of the capacitor serves as the output terminal of the delay inverter circuit.

Optionally, the delay inverter circuit includes: a first inverter, a second inverter, a third inverter, a first capacitor, and a second capacitor; the input terminal of the first inverter is connected to the output terminal of the enabling unit, the first inverter output terminal is connected to the first end of the first capacitor and further connected to the input terminal of the second inverter; the second inverter's output terminal is connected to the first end of the second capacitor, and also to the input terminal of the third inverter; the second ends of the first capacitor and the second capacitor are both grounded, and the output terminal the third inverter serves as the output terminal of the delay invertor circuit.

Optionally, the AND operation unit includes a NAND gate and a NOT gate connected to the NAND gate.

Optionally, the first rising edge of the instant pulse control signal and the rising edge of the enable signal occur simultaneously.

The present invention also provides a memory device with a power module. The power module includes: a voltage raise unit having a power output terminal for outputting a power supply voltage; an enabling unit, connected to the power output terminal, is used to generate an enable signal. When the voltage at the power output terminal drops to a set value, the enable signal generates a rising edge. A control unit includes: an oscillator, a pulse generator, and an OR operation unit; the oscillator is connected to the output terminal of the enabling unit. The oscillator is triggered by the rising edge of the enabling signal, and generates a delayed pulse control signal of a certain period. The pulse generator is connected to the output terminal of the enabling unit and is used to synchronously generate an instant pulse control signal while receiving the rising edge of the enabling signal. The OR operation unit is connected to the output terminals of the oscillator and the pulse generator, and performs the OR calculation between the delay pulse control signal and the instant pulse control signal to generate a boost control signal. The output terminal of the control unit is connected to the voltage raise unit and is configured to output the boost control signal to the voltage raise unit, and control the voltage raise unit to increase the output power supply voltage.

Optionally, the voltage raise unit is a charge pump circuit.

Optionally, the enabling unit includes: a comparator and a voltage divider circuit, one terminal of the voltage divider circuit is connected to the power output terminal, the other terminal is grounded, and the output terminal of the voltage divider circuit is connected to negative input terminal of the comparator and the positive terminal is connected to the reference voltage terminal, and the voltage value of the reference voltage terminal is the set value.

Optionally, the voltage dividing circuit includes: a first voltage dividing resistor and a second voltage dividing resistor, a first end of the first voltage dividing resistor is connected to the power output terminal, and the second end of the first voltage dividing resistor is connected to the first end of the second voltage dividing resistor, the second end of the second voltage dividing resistor is grounded, and the connecting note of the first voltage dividing resistor and the second voltage dividing resistor serves as the output point of the voltage divider circuit.

Optionally, the OR operation unit includes a NOR gate and a NOT (an inverter) gate connected in sequence, and the two input terminals of the NOR gate are respectively connected to the output terminals of the pulse generator and the oscillator. The output terminal of the NOR gate is connected to the input terminal of the NOT gate, and the output terminal of the NOT gate is connected to the input terminal of the voltage raise unit.

Optionally, the pulse generator includes a delay inversion circuit and an AND operation unit; the input terminal of the delay inversion circuit is connected to the output terminal of the enabling unit for enabling, is used to invert and output an delayed enable signal; the AND operation unit is connected to the output terminal of the delay inversion circuit and the output terminal of the enabling unit, and performs an AND operation for the signal output from the delay inversion circuit and the enable signal.

Optionally, the delay invertor circuit includes: a first inverter, a resistor, and a capacitor, the input terminal of the first inverter is connected to the output terminal of the enabling unit, and the first inverter's output terminal is connected to the first end of the resistor, the second end of the resistor is connected to the first end of the capacitor, the second end of the capacitor is grounded, and the first end of the capacitor serves as the output terminal of the delay inverter circuit.

Optionally, the delay inverter circuit includes: a first inverter, a second inverter, a third inverter, a first capacitor, and a second capacitor; the input terminal of the first inverter is connected to the output terminal of the enabling unit, the output terminal of the first inverter is connected to the first end of the first capacitor and the input terminal of the second inverter; the output terminal of the inverter is connected to the first end of the second capacitor and further to the input terminal of the third inverter; the second ends of the first capacitor and the second capacitor are both grounded, and the output terminal of the third inverter is the output terminal of the delay inversion circuit.

Optionally, the AND operation unit includes a NAND gate and a NOT gate connected to the NAND gate.

Optionally, the first rising edge of the instant pulse control signal and the rising edge of the enable signal are generated simultaneously.

The power module of the present invention can supplement energy to the voltage raise unit in time after detecting the voltage drop at the output terminal of the power supply, and adjust the output back to the normal voltage, so that the output terminal of the power supply can be supplemented with energy without waiting. Thereby, the output voltage drop is reduced and errors in subsequent circuits are prevented.

BRIEF DESCRIPTION OF THE DRAWINGS

By describing its exemplary embodiments in detail with reference to the accompanying drawings, the above and other objectives, features and advantages of the present disclosure will become more apparent.

Figure 1A:
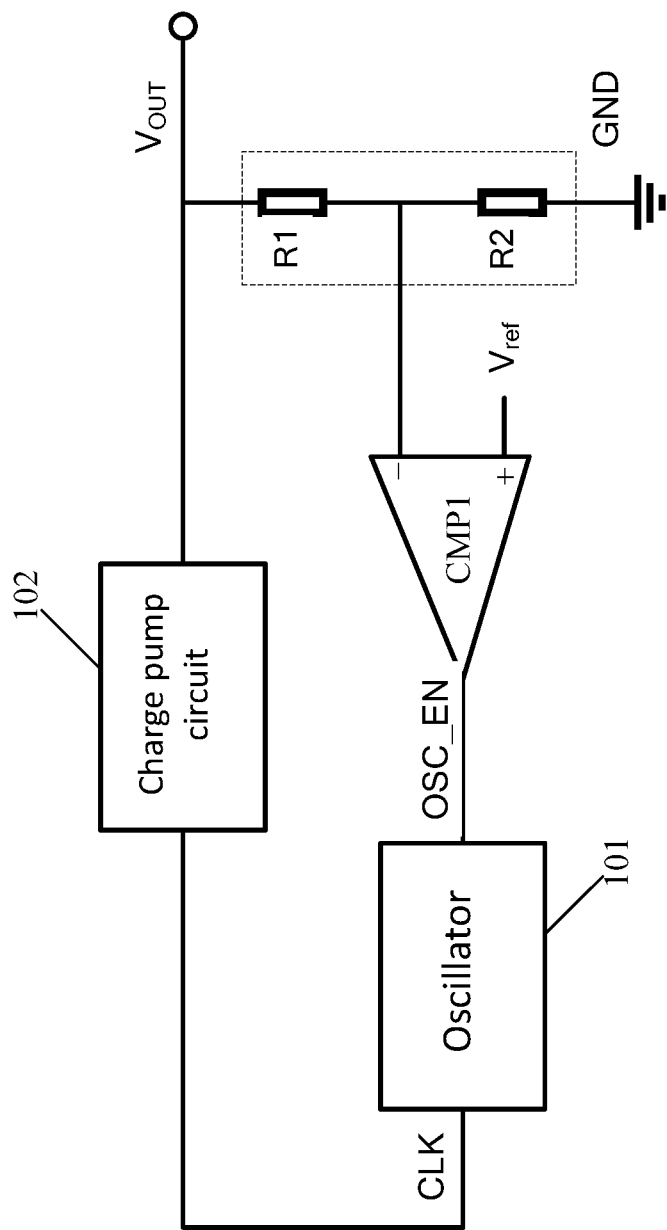
FIG. 1a is a schematic diagram of a power module structure in the existing technology.
Figure 1B:
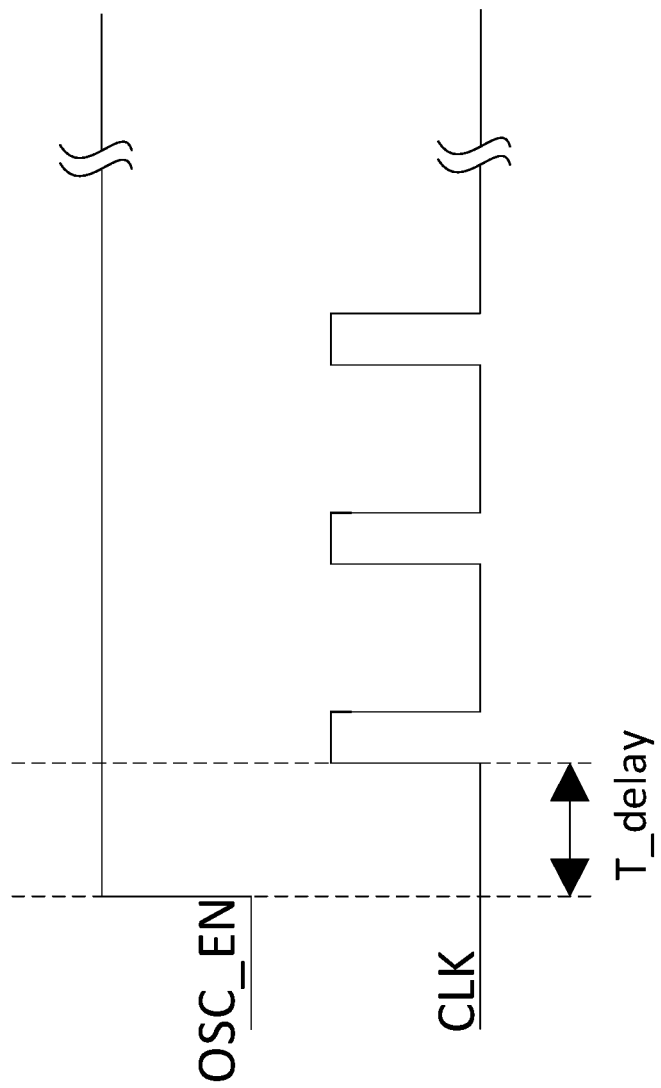
FIG. 1b is a schematic time sequence of various signals of the power module in the existing technology.

Listed below are definitions of various reference numbers in FIGS. 1-6:
101 oscillator; 102 charge pump circuit; 201 voltage raise unit; 202 enable unit; 2021 voltage divider circuit; 203 control unit; 2031 oscillator; 2032 pulse generator; 2033 or operation unit; 601 delay inversion Circuit; 602 AND operation unit; Vout power output; R1 resistance; R2 resistance; R resistance; CMP1 comparator; CMP2 comparator; Vref reference voltage; OSC_EN enable signal; OSC_EN2 enable signal; CLK boost control Signal; CLK2' boost control signal; T_delay; T delay time; INV inverter; INV4 inverter; C' capacitor; C3 capacitor; M1 transistor; M2 transistor; CLOAD load capacitor; Vcc power supply; R11 first voltage divider resistor; R12 second voltage divider resistor; Vref2 reference voltage; CLK2 delayed pulse control signal; one-shot instant pulse control signal; NOR1 NOR gate; NOT1 NOT gate; NOT2 NOT gate; INV1 first inverter; INV2 Second inverter; INV3 third inverter; C1 first capacitor; C2 second capacitor; NAND1 NAND gate; NOT2 inverter; and ILOAD load current.

DETAILED DESCRIPTION OF THE PREFERRED EMBODIMENTS

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

The present disclosure effectively overcomes various disadvantages in the prior arts and hence has high industrial usage value. The foregoing embodiments only illustrate the principle and efficacy of the present disclosure exemplarily, and are not meant to limit variations of the technique. Any person skilled in the art can make modifications on the foregoing embodiments without departing from the spirit and scope of the present disclosure. Accordingly, all equivalent modifications or variations completed by those with ordinary skill in the art without departing from the spirit and technical thinking disclosed by the present disclosure should fall within the scope of claims of the present disclosure.

Example embodiments will now be described more fully with reference to the accompanying drawings. However, the example embodiments can be implemented in various forms, and should not be construed as being limited to the examples set forth herein; on the contrary, the provision of these embodiments makes the present disclosure more comprehensive and complete, and fully conveys the concept of the example embodiments To those skilled in the art. The drawings are only schematic illustrations of the present disclosure and are not necessarily drawn to scale. The same reference numerals in the figures denote the same or similar parts, and thus their repeated description will be omitted.

Furthermore, the described features, structures or characteristics can be combined in one or more embodiments in any suitable manner. In the following description, many specific details are provided to give a sufficient understanding of the embodiments of the present disclosure. However, those skilled in the art will realize that the technical solutions of the present disclosure can be practiced without one or more of the specific details, or other methods, components, devices, steps, etc. can be used. In other cases, well-known structures, methods, devices, implementations, or operations are not shown or described in detail to avoid overwhelming attention and obscure all aspects of the present disclosure.

In addition, the terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features.

The exemplary embodiments of the present disclosure are specifically shown and described above. It should be understood that the present disclosure is not limited to the detailed structure, arrangement or implementation method described herein; on the contrary, the present disclosure intends to cover various modifications and equivalent arrangements included in the spirit and scope of the appended claims.

As described in the background art, the response of an existing power module is relatively slow, which often leads to the problem of unstable output voltage.

Please refer to FIG. 1a, which is a schematic diagram of an existing power module structure.

The power module includes: a charge pump circuit 102, the power output terminal Vout outputs a power voltage to the load, the power output terminal Vout connects to a resistor R1 and a resistor R2 in series to the ground, and the resistor R1 and the resistor R2 combine as a voltage divider circuit, the connection note of the two is connected to the negative input terminal of the comparator CMP1, the positive input terminal of the comparator CMP1 is connected to the reference voltage Vref, and the output terminal of the comparator CMP1 connects to the oscillator 101, further connects to the charge pump circuit 102 through the output terminal of the oscillator 101.

In the low power consumption mode, the input voltage of the negative input terminal of the comparator CMP1 is greater than the reference voltage Vref, and the output enable signal OSC_EN of the comparator CMP1 is low. At this time, the oscillator 101 is turned off to save power. In this mode, if the load on the power output terminal Vout suddenly becomes heavy, the output power voltage Vout will be pulled down quickly, the output enable signal OSC_EN of the comparator CMP1 is at high level, and the oscillator 101 is enabled. From the time the oscillator 101 is enabled from receiving the enable signal OSC_EN to the time a pulse signal CLK starts, there will be a delay T_delay (please refer to FIG. 1b). During this time, no energy is supplied to the output capacitor of the charge pump circuit 102, so the output voltage Vout will continue to drop, resulting in a larger drop in the output voltage Vout, which will affect the stability of the subsequent modules.

It can be seen that reducing the pulse delay of the boost control signal CLK for controlling the boost of the charge pump circuit 102 can reduce the drop in the output voltage Vout, and produce energy to the charge pump circuit 102 in time to stabilize the output power supply voltage.

Based on this, a new power module is proposed to reduce the output voltage drop, the new power module can respond quickly when the load suddenly becomes heavy.

Figure 2:
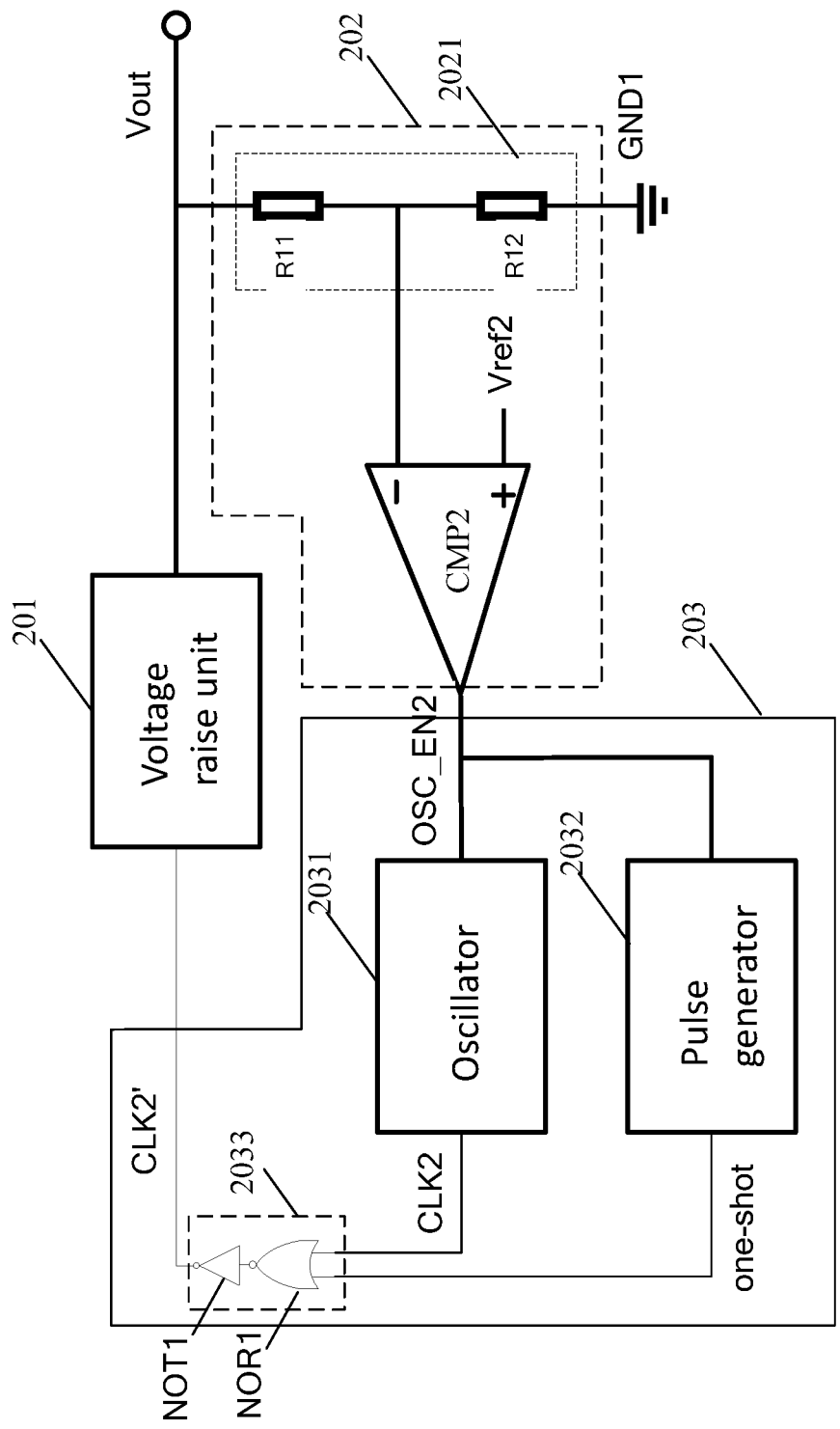
FIG. 2 is a schematic diagram of the structure of a power module according to some embodiments of the present invention.

FIG. 2 is a schematic diagram of a power module structure according to some embodiments of the present invention.

In this embodiment, the power module includes: a voltage raise unit 201, an enabling unit 202, and a control unit 203.

The voltage raise unit 201 has a power output terminal Vout for outputting a power voltage Vout.

The voltage raise unit 201 includes a load capacitor, one end of the load capacitor serves as a power output terminal Vout, and the load capacitor is charged to output a power supply voltage. When the output drops, the output voltage can be pulled up by supplementing energy to the load capacitor. In an embodiment of the present invention, the voltage raise unit 201 may be a charge pump circuit.

Figure 3:
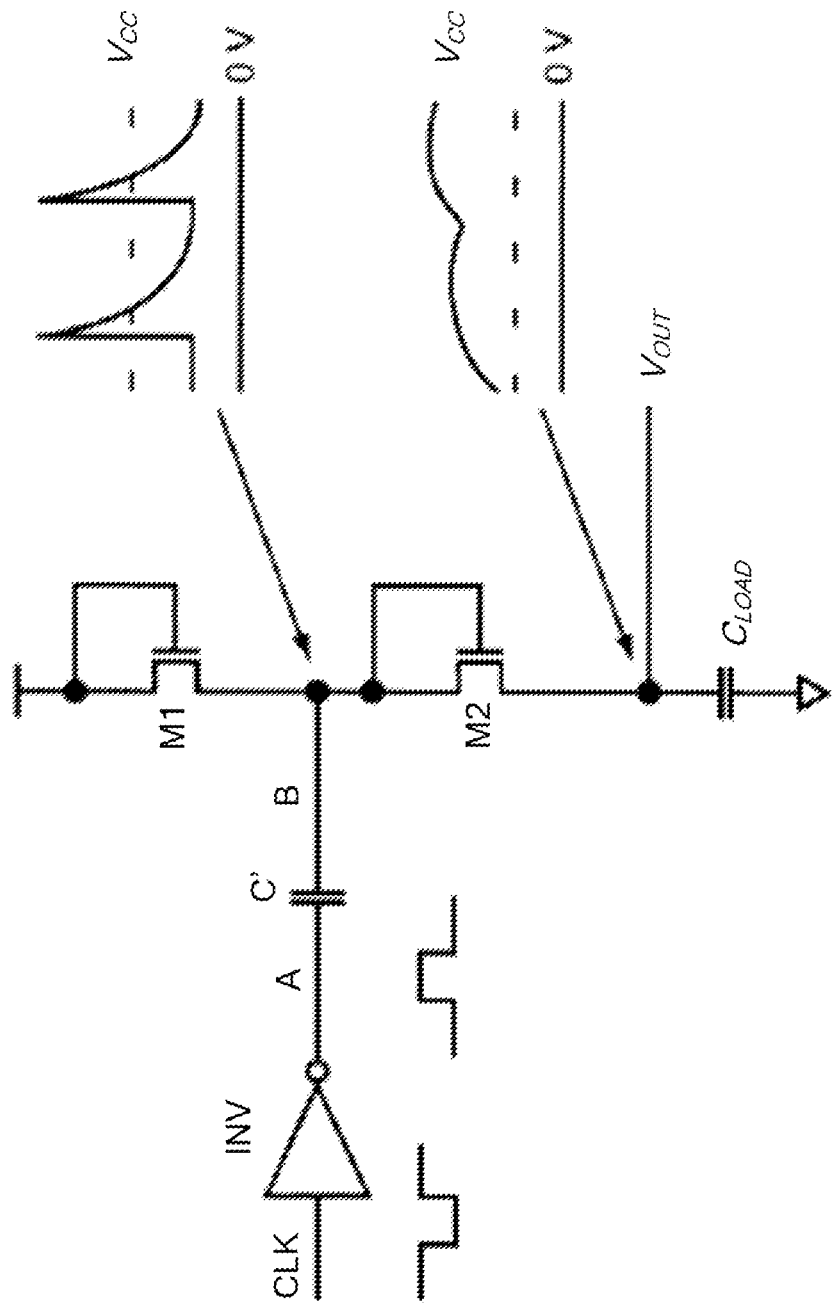
FIG. 3 is a schematic diagram of a voltage raise unit of a power module according to some embodiments of the present invention.

FIG. 3 is a schematic circuit diagram of the voltage raise unit 201 according to some embodiments of the present invention.

In this embodiment, the voltage raise unit 201 includes an inverter INV, a capacitor C', a transistor M1 and a transistor M2, and a load capacitor $C_{LOAD}$. The drain of the transistor M1 is connected to the power source Vcc, the source is connected to the drain of the transistor M2, the source of the transistor M2 is connected to the first end of the load capacitor $C_{LOAD}$, and the second end of the load capacitor $C_{LOAD}$ is grounded. The gates of the transistor M1 and the transistor M2 are both connected to the drains. The input terminal of the inverter INV is used to input the boost control signal CLK, the output terminal of the inverter INV is connected to the first end A of the capacitor C', and the other end B of the capacitor C' is connected to the connecting note between the transistors M1 and M2. The capacitor C' is charged by the boost control signal CLK, thereby supplementing energy to the load capacitor $C_{LOAD}$ and increasing the power supply voltage output by the first end of the load capacitor $C_{LOAD}$.

In other embodiments, the voltage raise unit 201 may also adopt a charge pump circuit of another structure, or adopt a voltage raise unit of another structure that can be controlled by a pulse signal. Those skilled in the art can reasonably select a suitable circuit structure as the voltage raise unit 201 according to the requirements of the output voltage of the power module.

The enabling unit 202 is connected to the power output terminal Vout for generating an enabling signal, and when the voltage of the power output terminal Vout drops to a set value, the enabling signal generates a rising edge. The enabling unit 202 is used to detect the voltage of the power output terminal Vout.

In this implementation, the enabling unit 202 includes a voltage divider circuit 2021 and a comparator CMP2. One terminal of the voltage divider circuit 2021 is connected to the power output terminal Vout, and the other terminal is grounded to GND1. The output terminal of the voltage divider circuit 2021 is connected to the negative input terminal of the comparator CMP2, and the positive input terminal of the comparator CMP2 is connected to the reference voltage terminal, and the reference voltage value Vref2 is a set value.

The voltage at the output terminal of the voltage divider circuit 2021 varies with the voltage at the output terminal Vout of the power module. Preferably, it is proportional to the voltage at the output terminal Vout of the power module, and can accurately reflect the output voltage of the output terminal Vout of the power module and changes. In this embodiment, the voltage divider circuit 2021 includes a first voltage divider resistor R11 and a second voltage divider resistor R12, a first end of the first voltage divider resistor R11 is connected to the power output terminal Vout, and the second end of the first voltage divider resistor R11 is connected to the first end of the second voltage divider resistor R12, the second end of the second voltage divider resistor R12 is grounded to GND1, the connecting end of the first voltage divider resistor R11 and the second voltage dividing resistor R12 serves as the output end of the voltage dividing circuit 2021. The resistances of the first voltage dividing resistor R11 and the second voltage dividing resistor R12 can be selected rationally according to the requirement of the voltage division ratio. In other implementations, the voltage divider circuit 2021 may also have other circuit structures. In other embodiments, the voltage divider circuit 2021 of the enabling unit 202 may also be another circuit structure capable of monitoring the output terminal voltage Vout of the power module at any time.

When the output voltage of the power module output terminal Vout is high, the output voltage value of the voltage divider circuit 2021 to the negative input terminal of the comparator CMP2 is greater than the reference voltage Vref2 at the positive input terminal, and the enable signal OSC_EN2 output by the comparator CMP2 is low, the oscillator 2031 turns off. When the power module voltage Vout decreases, the voltage value of the voltage divider circuit 2021 output to the negative input terminal of the comparator CMP2 is less than the reference voltage Vref2 of the positive input terminal, then the enable signal OSC_EN2 from the comparator CMP2 generates a rising edge and becomes a high level signal, which triggers the oscillator 2031 to work.

The enabling unit 202 outputs a corresponding enabling signal OSC_EN2 according to the voltage change of the power output terminal Vout.

The control unit 203 includes: an oscillator 2031, a pulse generator 2032, and an OR operation unit 2033.

The input terminal of the oscillator 2031 is connected to the output terminal of the enabling unit 202. When the enable signal OSC_EN2 is at a high level, the oscillator 2031 is triggered by the enable signal OSC_EN2 for generating a certain periodic delayed pulse control signal CLK2.

The pulse generator 2032 is connected to the output terminal of the enabling unit 202, and is used for synchronously generating an instant pulse control signal one-shot while receiving the rising edge of the enabling signal OSC_EN2. In this specific embodiment, the pulse generator 2032 is triggered by the rising edge of the enable signal OSC_EN2 to generate the instant pulse control signal "one-shot" as a single pulse signal, that is, there has only one pulse.

The OR operation unit 2033 is connected to the output terminals of the oscillator 2031 and the pulse generator 2032, and performs OR calculation on the delayed pulse control signal CLK2 and the instant pulse control signal "one-shot" to generate the boost control signal CLK2'.

In this implementation, the OR operation unit 2033 includes a NOR gate NOR1 and a NOT gate NOT1 connected in sequence, and two input terminals of the NOR gate NOR1 are respectively connected to the output terminal of the pulse generator 2032 and the output terminal of the oscillator 2031, the output terminal of the NOR gate NOR1 is connected to the input terminal of the NOT gate NOT1, and the output terminal of the NOT gate NOT1 is connected to the input terminal of the voltage raise unit 201.

The output terminal of the control unit 203 is connected to the voltage raise unit 201 for outputting the boost control signal CLK2' to the voltage raise unit 201, and controls the voltage raise unit 201 to increase the output power module voltage.

Figure 4:
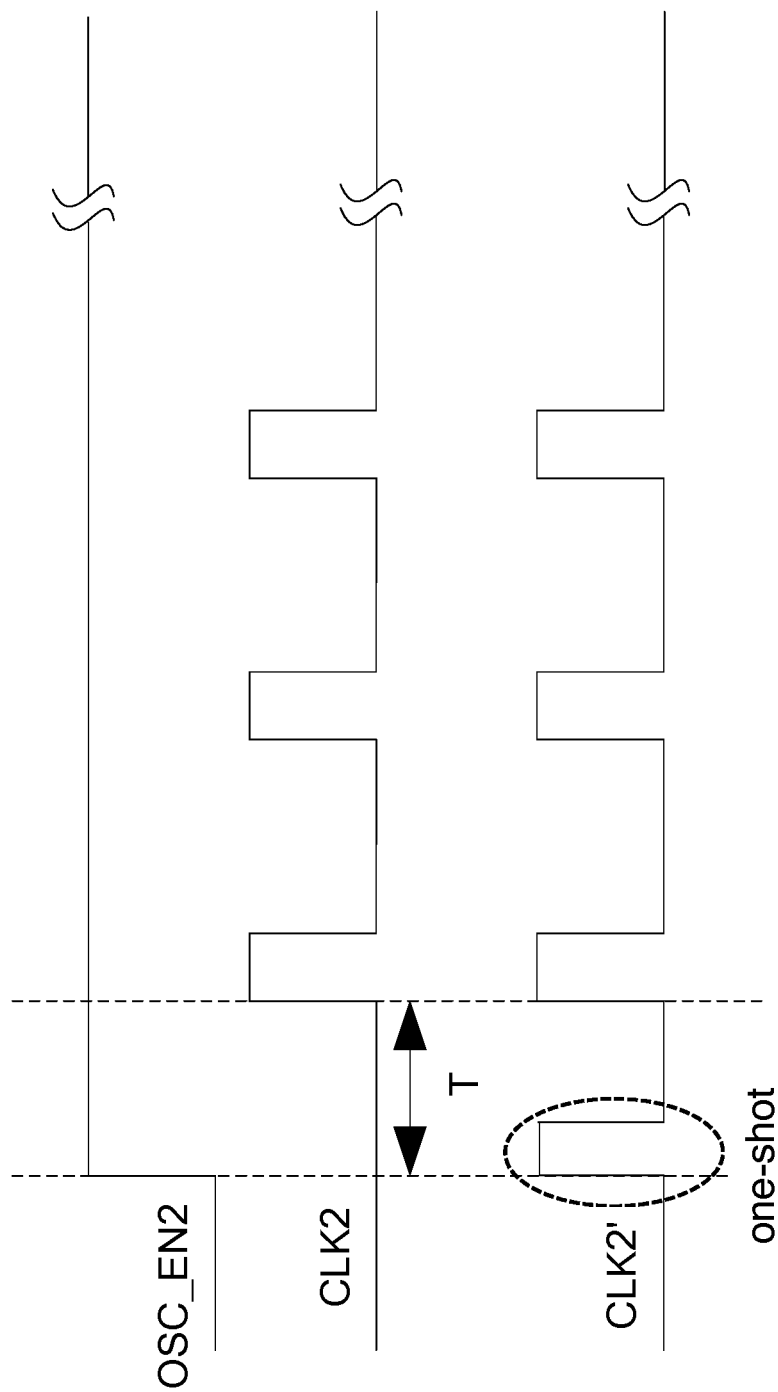
FIG. 4 is a schematic time sequence of various signals in the power module in some embodiments of the present invention.

FIG. 4 is a timing diagram of various signals in the power module in an embodiment of the present invention.

In this embodiment, when the load on the power output terminal Vout becomes heavy, the output voltage decreases, so that the enable signal OSC_EN2 becomes a high level, so that the oscillator 2031 is enabled and outputs a delay pulse control signal CLK2. According to the circuit characteristics of the oscillator 2031, the first pulse of the delay pulse control signal CLK2 is delayed after the enable signal OSC_EN2 turning to a high level (that is, the rising edge moment), and the delay time is T.

Once the pulse generator 2032 receives the high-level enable signal OSC_EN2, it will generate an instant pulse control signal "one-shot", and the rising edge of the instant pulse control signal "one-shot" is basically aligned with the rising edge of the enable signal OSC_EN2, both are produced at the same time or almost at the same time.

The OR operation unit 2033 performs an OR operation on the delay pulse control signal CLK2 and the instant pulse control signal "one-shot" to generate a boost control signal CLK2'. Within the delay time T, the boost control signal CLK2' is an instant pulse from the instant pulse control signal "one-shot", followed by the delayed pulse control signal CLK2.

When detecting the voltage drop of the power output terminal Vout and the enable signal OSC_EN2 turning into a high level, the disclosed power module immediately generates a pulse of the boost control signal CLK2' to supplement the energy of the voltage raise unit 201 in time to raise the voltage at the output terminal Vout of the power module, so the output voltage is adjusted back to normal. Since the instant pulse control signal "one-shot" signal is generated immediately when the oscillator 2031 is enabled, and supplies the power output terminal Vout with energy via the voltage raise unit 201, the output terminal Vout does not need to wait for time T to obtain energy supplementation, thus It can reduce the output voltage drop and prevent errors in subsequent circuits.

The pulse generator 2032 includes a delay invertor circuit and an AND operation unit; the input terminal of the delay inversion circuit is connected to the output terminal of the enabling unit 202 for inverting the enabling signal delaying output; the AND operation unit is connected to the output terminal of the delay invertor circuit and the output terminal of the enabling unit 202, and performs an AND calculation between the signal output by the delay invertor circuit and the enable signal.

Figure 5A:
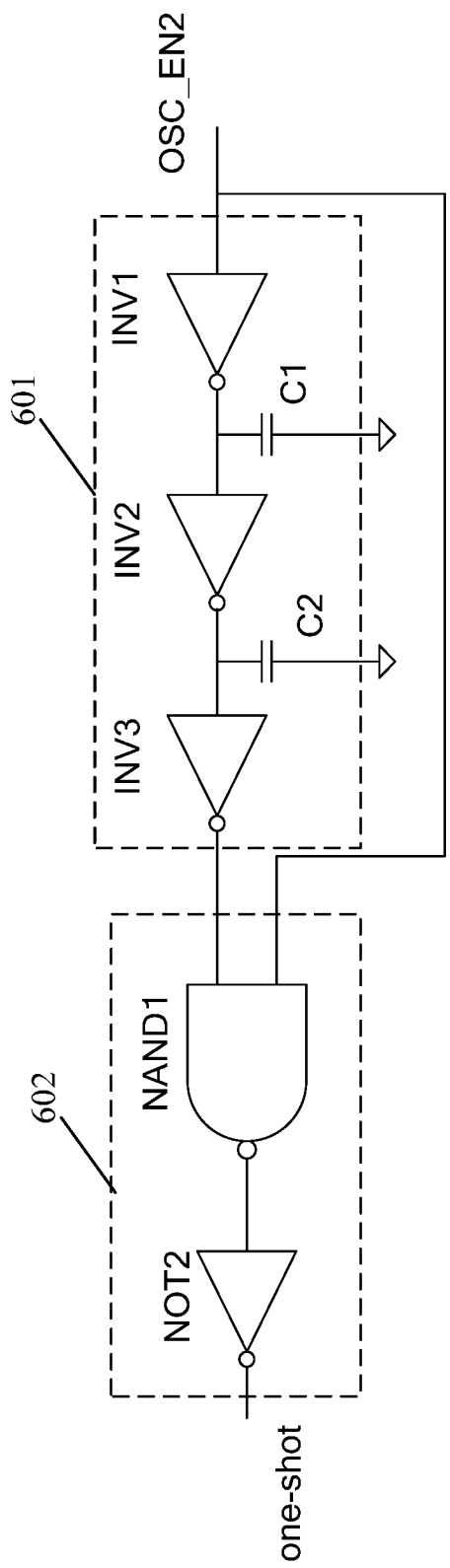
FIG. 5a is a schematic diagram of a pulse generator circuit structure of a power module according to some embodiments of the present invention.

FIG. 5*a* is a schematic structural diagram of a pulse generator according to an embodiment of the present invention.

The pulse generator 2032 includes the delay inversion circuit 601 and the AND operation unit 602.

The delay invertor circuit 601 includes: a first inverter INV1, a second inverter INV2, a third inverter INV3, a first capacitor C1 and a second capacitor C2. The input terminal of the first inverter INV1 is connected to the output terminal of the enabling unit 202, and the output terminal of the first inverter INV1 is connected to the first end of the first capacitor C1 and to the input terminal of the second inverter INV2. The output terminal of the second inverter INV2 is connected to the first end of the second capacitor C2 and to the input terminal of the third inverter INV3. The second terminals of the first capacitor C1 and the second capacitor C2 are all grounded. The output terminal of the third inverter INV3 serves as the output terminal of the delay inverter circuit 601.

The AND operation unit 602 includes a NAND gate NAND1, and a NOT gate NOT2 connected to the gate NAND1. The two input terminals of the NAND gate NAND1 are respectively connected to the output terminal of the enabling unit 202 and the output terminal of the delay invertor circuit 601. The output terminal of the NAND gate NAND1 is connected to the input terminal of the NOT gate NOT2, and the output terminal of the NOT gate NOT2 serves as the output terminal of the pulse generator 2032.

The delay invertor circuit 601 includes a first capacitor C1 and a second capacitor C2. When the enable signal OSC_EN2 output from the enable unit 202 turns high, it is necessary to charge the capacitors C1 and C2 first before outputting an inverted enable signal OSC_EN2, which means the enable signal has a low level output to the AND operation unit 602 after a delay. Therefore, the AND operation unit 602 performs an AND operation to the enable signal OSC_EN2 and the delay inversion circuit 601, and outputs a high level for a certain period of time. After the delay inversion circuit 601 outputs a low level, the AND operation unit 602 outputs low level. Therefore, the pulse generator 2032 will generate a high level at the moment when OSC_EN2 changes to a high level and within a certain period of time, and then generate a low level, thereby form an instant control pulse "one-shot". The pulse width of the "one-shot" real-time control pulse can be varied by adjusting the first capacitor C1 and the second capacitor C2, so as to avoid the situation that the energy supplement of the voltage raise unit 201 is too small due to the pulse width being too small, or the energy supplement of the voltage raise unit 201 is too large due to the pulse width being too wide, resulting in an overshoot of the output voltage. Preferably, the pulse width of the "one-shot" can be adjusted to be close to or the same with the pulse width generated by the oscillator 203.

Figure 5B:
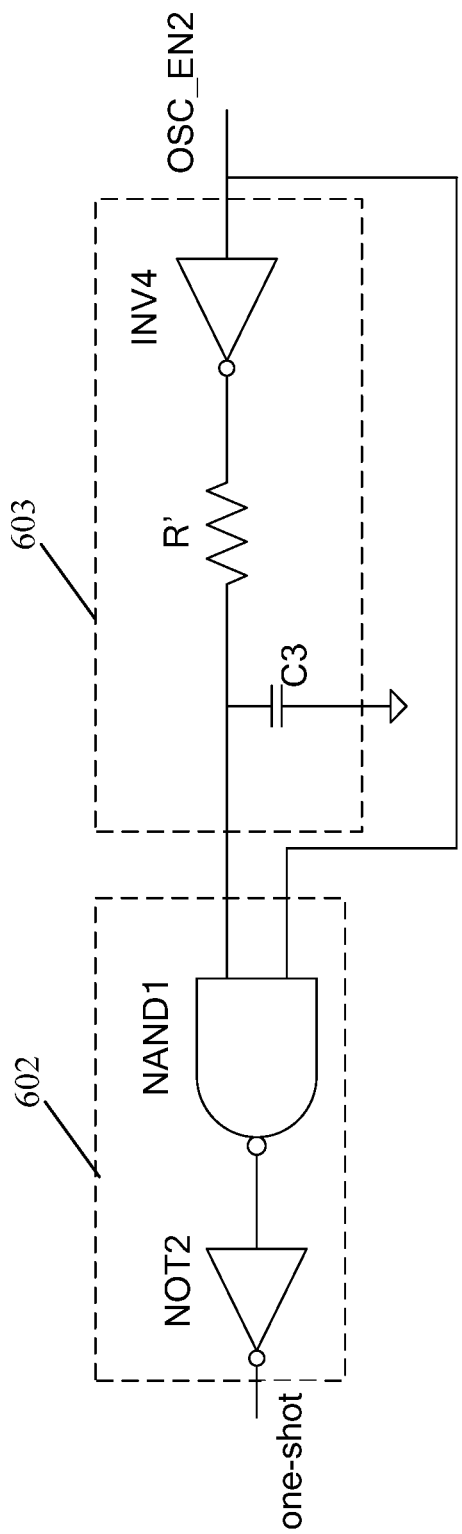
FIG. 5b is a schematic diagram of a pulse generator circuit structure of a power module according to some embodiments of the present invention.

FIG. 5*b*, which is a schematic structural diagram of a pulse generator according to another embodiment of the present invention.

In this embodiment, another circuit structure of the delay invertor circuit 603 is provided. The delay invertor circuit 603 includes an inverter INV4, a resistor R', and a capacitor C3. The input terminal of the inverter INV4 is connected to the output terminal of the enabling unit 202, and the output terminal of the inverter INV4 is connected to the first end of the resistor R', the second end of the resistor R' is connected to the first end of the capacitor C3, the second end of the capacitor C3 is grounded, and the first end of the capacitor C3 serves as the output terminal of the delay inversion circuit 603.

The delay inversion circuit 603 includes a capacitor C3. When the enable signal OSC_EN2 from the enable unit 202 changes to a high level, the capacitor C3 needs to be charged before the enable signal OSC_EN2 can be inverted, which means, only after a period of delay, the low level output can be sent to the AND operation unit 602. Therefore, the AND operation unit 602 performs an AND operation between the enable signal OSC_EN2 and the delay inversion circuit 603, and it outputs a high level for a certain period of time, and the AND operation unit 602 outputs a low level only after the delay inversion circuit 603 outputs a low level. Therefore, the pulse generator 2032 still generates a high level when and even after the enable signal OSC_EN2 generates a rising edge to a high level within a certain period of time, then changes to a low level, thereby an instant control pulse "one-shot" appears.

In this embodiment, the charging time for the capacitor C3 can be adjusted by setting the capacitance on C3 and the resistance on R', thereby achieving the pulse width of the "one-shot" instant pulse.

In another embodiment of the present invention, the pulse generator 2032 or the delay invertor circuit 603 may also have other circuit structures as examples, which will not be described in details here. Those skilled in the art can reasonably choose proper circuit structures to realize the functions of the pulse generator 2032.

Figure 6:
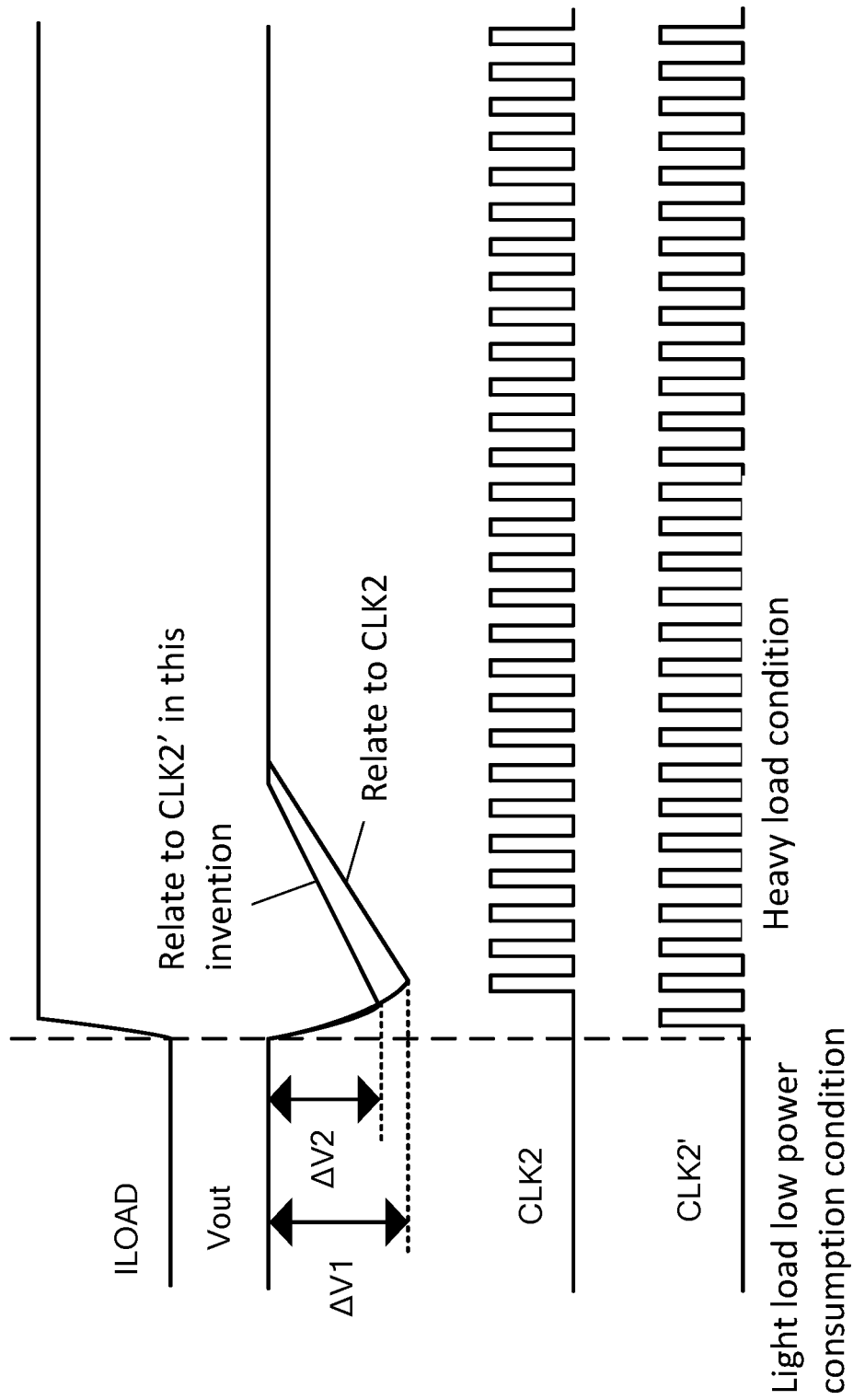
FIG. 6 shows the time sequence diagram illustrating output voltage changes in comparison with an existing power module.

FIG. 6 shows the time sequence diagram illustrating output voltage changes in comparison with an existing power module.

In the existing module, when in a heavy load state, the load current $I_{LOAD}$ increases, which causes the output terminal voltage Vout to decrease. Only the delayed pulse signal CLK2' output by the oscillator is used to supplement energy to the voltage raise unit 201 (please refer to the FIG. 6) to increase the voltage at the output terminal Vout of the power module. Since the delay pulse signal CLK2' delays after the power output voltage Vout drops, rise is gradual post the power voltage drop of $\Delta V1$.

In the disclosed embodiment, the pulse of the boost control signal CLK2' instantly generates a pulse signal after Vout drops, so as to reduce the amount of voltage drop at the power output terminal Vout. The voltage at the power output Vout will rise gradually after a drop of $\Delta V2$, where $\Delta V2 < \Delta V1$.

Here, the power module is in the light load and low power consumption mode, the oscillator 203 will also generate a pulse signal with a larger clock interval to maintain the stability of the output voltage Vout.

The power module of the above embodiments can instantly respond to the power output voltage drops, and is able to adjust the output voltage back to a normal level, thereby improving the response speed of the power module.

The specific implementation of the present invention also provides a memory device, such as a DRAM memory, using the above-mentioned power module. The power module can be used to provide word line drive voltage, bit line pre-charge voltage, in order to provide a stable power supply voltage to the memory devices. During frequently switch among various operation modes, the module load changes, and the load current changes in the memory chip's operation, the output voltage can be adjusted in time to maintain a stable power supply voltage output, thereby improving the reliability and stability of the memory devices.

The above are only the preferred embodiments of the present invention. It should be pointed out that for those of ordinary skill in the art, without departing from the principle of the present invention, many improvements and modifications can be made, and these improvements and modifications should also be considered as within the protection scope of the invention.

What is claimed is:

1. A power module, comprising:
   a voltage raise unit, wherein the voltage raise unit has a power output terminal for outputting a power voltage;
   an enabling unit, wherein the enabling unit connects to the power output terminal and generates an enable signal, wherein the enable signal is a pulse having a rising edge when the power voltage at the power output terminal drops to a set value of the power voltage;
   a control unit, wherein the control unit comprises:
   an oscillator, wherein the oscillator connects to an output terminal of the enabling unit, wherein the oscillator is triggered by the rising edge of the enable signal and generates a delayed pulse control signal at a certain period at an output terminal of the oscillator;
   a pulse generator, wherein the pulse generator connects to the output terminal of the enabling unit, and generates synchronously an instant pulse control signal at an output terminal of the pulse generator when receiving the rising edge of the enable signal; and
   an OR operation unit, wherein the OR operation unit connects to the output terminals of the oscillator and the pulse generator, and wherein the OR operation unit performs an OR operation on the delayed pulse control signal and the instant pulse control signal to generate a voltage raise control signal;
   wherein an output terminal of the control unit connects to the voltage raise unit, and outputs a boost control signal to the voltage raise unit to increase the power voltage.

2. The power module according to claim 1, wherein the voltage raise unit is a charge pump circuit.

3. The power module according to claim 1, wherein the enabling unit further comprises: a comparator and a voltage divider circuit, wherein a first terminal of the voltage divider circuit is connected to the power output terminal, a second terminal of the voltage raise unit is grounded; and wherein an output terminal of the voltage divider circuit is connected to a negative input terminal of the comparator, a positive input terminal of the comparator is connected to a reference voltage terminal, and a voltage value at the reference voltage terminal is a set value of the reference voltage.

4. The power module according to claim 3, wherein the voltage dividing circuit further comprises: a first voltage dividing resistor and a second voltage dividing resistor, wherein a first end of the first voltage dividing resistor is connected to the power output terminal, a second end of the first voltage dividing resistor is connected to a first end of the second voltage dividing resistor, a second end of the second voltage dividing resistor is grounded; and wherein a connecting note of the first voltage dividing resistor and the second voltage divider resistor serves as an output terminal of the voltage divider circuit.

5. The power module according to claim 1, wherein the OR operation unit further comprises a NOR gate and a NOT gate connected in sequence, wherein two input terminals of the NOR gate are respectively connected to the output terminal of the pulse generator and the output terminal of the oscillator, wherein an output terminal of the NOR gate is connected to an input terminal of the NOT gate, and wherein an output terminal of the NOT gate is connected to an input terminal of the voltage raise unit.

6. The power module according to claim 1, wherein the pulse generator further comprises a delay inverter circuit and an AND operation unit; wherein an input terminal of the delay inverter circuit connects to the output terminal of the enabling unit, inverts the enable signal and outputs it with a delayed signal at an output terminal of the delay inverter circuit; wherein the AND operation unit connects to the output terminal of the delay inversion circuit and the output terminal of the enable unit, performs an AND operation on the delayed signal from the delay inversion circuit and the enable signal.

7. The power module according to claim 6, wherein the delay inverter circuit comprises: a first inverter, a resistor and a capacitor, wherein an input terminal of the first inverter connects to the output terminal of the enabling unit, an output terminal of the first inverter connects to a first end of the resistor, a second end of the resistor connects to a first end of the capacitor, and a second end of the capacitor is grounded, and wherein the first end of the capacitor serves as the output terminal of the delay inverter circuit.

8. The power module according to claim 6, wherein the delay inverter circuit comprises: a first inverter, a second inverter, a third inverter, a first capacitor, and a second capacitor; wherein an input terminal of the first inverter connects to the output terminal of the enabling unit, an output terminal of the first inverter connects to a first end of the first capacitor and the second inverter; wherein an output terminal of the second inverter connects to a first end of the second capacitor and an input terminal of the third inverter; wherein second ends of the first capacitor and the second capacitor are grounded; and wherein an output terminal of the third inverter is used as the output terminal of the delay inverter circuit.

9. The power module according to claim 6, wherein the AND operation unit comprises a NAND gate and a NOT gate connected to the NAND gate.

10. The power module according to claim 6, wherein a first rising edge of the instant pulse control signal and the rising edge of the enable signal are generated simultaneously.

11. A memory device, comprising a power module, wherein the power module comprises:
a voltage raise unit, wherein the voltage raise unit has a power output terminal for outputting a power voltage;
an enabling unit, wherein the enabling unit connects to the power output terminal and generates an enable signal, wherein the enable signal is a pulse having a rising edge when the power voltage at the power output terminal drops to a set value of the power voltage;
a control unit, wherein the control unit comprises:
an oscillator, wherein the oscillator connects to an output terminal of the enabling unit, wherein the oscillator is triggered by the rising edge of the enable signal and generates a delayed pulse control signal at a certain period at an output terminal of the oscillator;
a pulse generator, wherein the pulse generator connects to the output terminal of the enabling unit, and generates synchronously an instant pulse control signal at an output terminal of the pulse generator when receiving the rising edge of the enable signal; and
an OR operation unit, wherein the OR operation unit connects to the output terminals of the oscillator and the pulse generator, and wherein the OR operation unit performs an OR operation on the delayed pulse control signal and the instant pulse control signal to generate a voltage raise control signal;
wherein an output terminal of the control unit connects to the voltage raise unit, and outputs a boost control signal to the voltage raise unit to increase the power voltage.

12. The memory device of claim 11, wherein the voltage raise unit is a charge pump circuit.

13. The memory device according to claim 11, wherein the enabling unit further comprises: a comparator and a voltage divider circuit, wherein a first terminal of the voltage divider circuit is connected to the power output terminal, a second terminal of the voltage raise unit is grounded; and wherein an output terminal of the voltage divider circuit is connected to a negative input terminal of the comparator, a positive input terminal of the comparator is connected to a reference voltage terminal, and a voltage value at the reference voltage terminal is a set value of the reference voltage.

14. The memory device according to claim 13, wherein the voltage dividing circuit further comprises: a first voltage dividing resistor and a second voltage dividing resistor, wherein a first end of the first voltage dividing resistor is connected to the power output terminal, a second end of the first voltage dividing resistor is connected to a first end of the second voltage dividing resistor, a second end of the second voltage dividing resistor is grounded; and wherein a connecting note of the first voltage dividing resistor and the second voltage divider resistor serves as an output terminal of the voltage divider circuit.

15. The memory device according to claim 11, wherein the OR operation unit comprises a NOR gate and a NOT gate connected in sequence, wherein two input terminals of the NOR gate are respectively connected to the output terminal of the pulse generator and the output terminal of the oscillator, wherein an output terminal of the NOR gate is connected to an input terminal of the NOT gate, and wherein an output terminal of the NOT gate is connected to an input terminal of the voltage raise unit.

16. The memory device according to claim 11, wherein the pulse generator further comprises a delay inverter circuit and an AND operation unit; wherein an input terminal of the delay inverter circuit connects to the output terminal of the enabling unit, inverts the enable signal and outputs it with a delayed signal at an output terminal of the delay inverter circuit; wherein the AND operation unit connects to the output terminal of the delay inversion circuit and the output terminal of the enable unit, performs an AND operation on the delayed signal from the delay inversion circuit and the enable signal.

17. The memory device according to claim 16, wherein the delay inverter circuit comprises: a first inverter, a resistor and a capacitor, wherein an input terminal of the first inverter connects to the output terminal of the enabling unit, an output terminal of the first inverter connects to a first end of the resistor, a second end of the resistor connects to a first end of the capacitor, and a second end of the capacitor is grounded, and wherein the first end of the capacitor serves as the output terminal of the delay inverter circuit.

18. The memory device according to claim 16, wherein the delay invertor circuit comprises: a first inverter, a second inverter, a third inverter, a first capacitor, and a second capacitor; wherein an input terminal of the first inverter connects to the output terminal of the enabling unit, an output terminal of the first inverter connects to a first end of the first capacitor and the second inverter; wherein an output terminal of the second inverter connects to a first end of the second capacitor and an input terminal of the third inverter; wherein second ends of the first capacitor and the second capacitor are grounded; and wherein an output terminal of the third inverter is used as the output terminal of the delay inverter circuit.

19. The memory device according to claim 16, wherein the AND operation unit comprises a NAND gate and a NOT gate connected to the NAND gate.

20. The memory device of claim 16, wherein a first rising edge of the instant pulse control signal and the rising edge of the enable signal are generated simultaneously.

* * * * *